(12) United States Patent
Henrik et al.

(10) Patent No.: US 8,698,298 B2
(45) Date of Patent: Apr. 15, 2014

(54) LAMINATE ELECTRONIC DEVICE

(75) Inventors: Ewe Henrik, Burglengenfeld (DE);
Joachim Mahler, Regensburg (DE);
Anton Prueckl, Schierling (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 13/346,766

(22) Filed: Jan. 10, 2012

(65) Prior Publication Data

US 2013/0010446 A1    Jan. 10, 2013

Related U.S. Application Data

(62) Division of application No. 12/615,648, filed on Nov. 10, 2009, now Pat. No. 8,120,158.

(51) Int. Cl.
*H01L 23/02*    (2006.01)

(52) U.S. Cl.
USPC .... 257/686; 257/690; 257/723; 257/E21.502; 361/783

(58) Field of Classification Search
USPC ........... 257/686, 690, 723, E21.502; 361/783
See application file for complete search history.

(56) References Cited

U.S. PATENT DOCUMENTS

| | | |
|---|---|---|
| 2005/0287700 A1 | 12/2005 | Huang |
| 2007/0158807 A1 | 7/2007 | Lu et al. |
| 2007/0181988 A1 | 8/2007 | Han et al. |
| 2008/0116569 A1 | 5/2008 | Huang et al. |
| 2008/0150120 A1* | 6/2008 | Nishimura et al. ........... 257/690 |
| 2010/0163292 A1 | 7/2010 | Tsai et al. |

FOREIGN PATENT DOCUMENTS

| | | |
|---|---|---|
| DE | 102007017831 | 10/2008 |
| WO | 0137338 | 5/2001 |

OTHER PUBLICATIONS

Office Action mailed Mar. 22, 2011 in U.S. Appl. No. 12/615,648.

* cited by examiner

*Primary Examiner* — Long Pham
(74) *Attorney, Agent, or Firm* — Dicke, Billig & Czaja, PLLC

(57) ABSTRACT

A laminate electronic device comprises a first semiconductor chip, the first semiconductor chip defining a first main face and a second main face opposite to the first main face, and having at least one electrode pad on the first main face. The laminate electronic device further comprises a carrier having a first structured metal layer arranged at a first main surface of the carrier. The first structured metal layer is bonded to the electrode pad via a first bond layer of a conductive material, wherein the first bond layer has a thickness of less than 10 μm. A first insulating layer overlies the first main surface of the carrier and the first semiconductor chip.

5 Claims, 10 Drawing Sheets

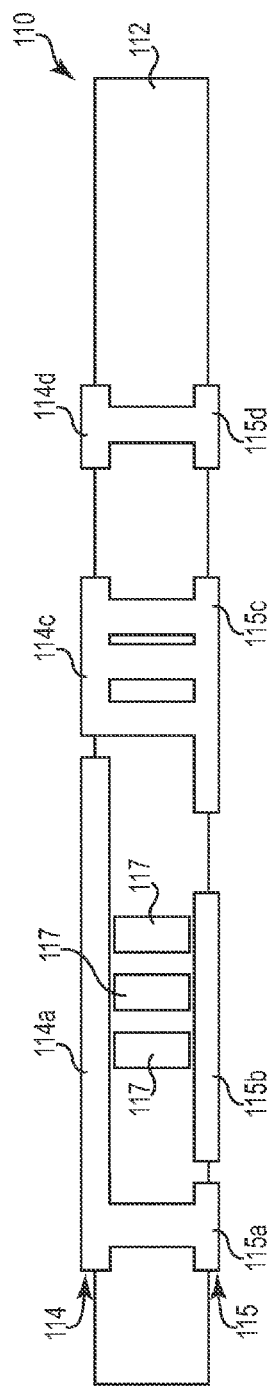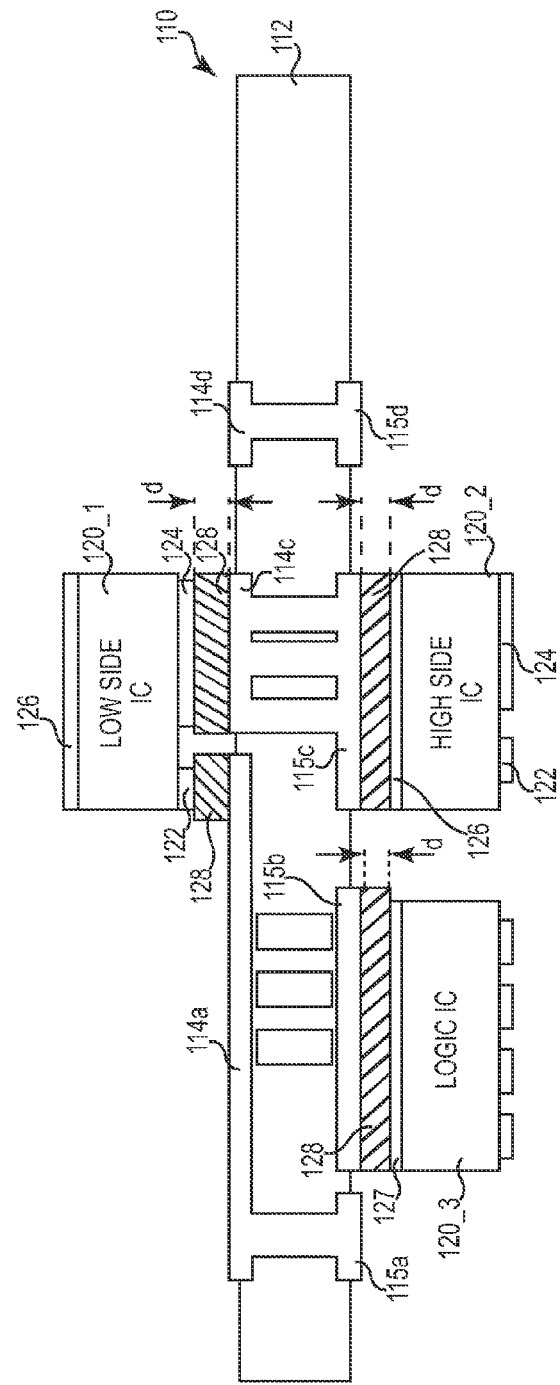

US 8,698,298 B2

LAMINATE ELECTRONIC DEVICE

CROSS-REFERENCE TO RELATED APPLICATION

This Application is a Divisional Application of application Ser. No. 12/615,648, filed Nov. 10, 2009, which is incorporated herein by reference.

BACKGROUND OF THE INVENTION

The invention relates to electronic devices, and more particularly to the technique of embedding semiconductor components into a laminate substrate such as e.g. into a printed circuit board.

Embedding semiconductor devices into a laminate substrate has been realized as a promising technology for applications in which size, thickness, costs and weight of electronic devices are sought to be minimized. Such requirements are often encountered in portable applications such as cellphones, laptop PCs, palms, PDUs (Personal Digital Assistant) etc., and are also of relevance in many other electronic applications such as power devices.

Recently, semiconductor chips have been directly embedded into PCBs (printed circuit boards) and build-up layers of SBU (Sequential Build-Up) laminate substrates. Promising embedded actives technologies should allow for low production costs, an efficient and reliable electrical connection method and high versatility in view of circuit design and routing capability. For these and other reasons, there is a need for the present invention.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIGS. 2A to 2E are sectional views schematically illustrating one embodiment of a method to produce a laminate electronic device 200.

DETAILED DESCRIPTION OF THE INVENTION

Figure 1A:
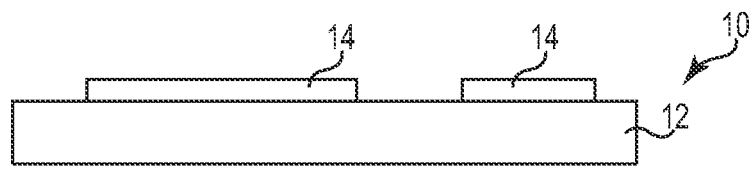
FIGS. 1A to 1F are sectional views schematically illustrating one embodiment of a method to produce a laminate electronic device 100.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the figures are not necessarily to scale.

In the following detailed description, reference is made to the accompanying drawings, which form a part thereof, and in which is shown by way of illustration specific embodiments in which the invention may be practiced. In this regard, directional terminology, such as e.g. "upper", "lower", "top", "bottom", "left-hand", "right-hand", "front side", "backside", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or micro-electromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads in particular on its two main surfaces, that is to say on its front side and backside. In particular, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include logic integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

Furthermore the semiconductor chips described herein may comprise electrode pads (or contact pads) on one or more of their outer surfaces wherein the electrode pads serve for electrically contacting the semiconductor chips or circuits integrated in the semiconductor chip. The electrode pads may have the form of lands, i.e. flat contact layers on an outer surface of the semiconductor chip. The electrode pads may be situated on the active main surfaces of the semiconductor chips or on both main surfaces. Any desired metal or metal alloy, for example aluminum, titanium, gold, silver, copper, palladium, platinum, nickel, chromium or nickel vanadium, may generally be used as the material. The metal layers need not be homogenous or manufactured from just one material, that is to say various compositions and concentrations of the materials contained in the metal layers are possible.

One or more semiconductor chips are mounted on a carrier and embedded in at least one electrically insulating layer or in a layer stack to form a laminate electronic device. The electrically insulating layer may have the shape of a foil or sheet, which is laminated on top of the semiconductor chip(s) and the carrier. The foil may be made of a polymer material. In one embodiment, the foil may be made of a polymer material which is coated with a metal layer, e.g. a copper layer (so-called RCC (Resin Coated Copper) foil). Heat and pressure may be applied for a time suitable to attach the polymer foil or sheet to the underlying structure. During lamination, the electrically insulating foil or sheet is capable of flowing (i.e. is in a plastic state), resulting in that gaps between the semiconductor chips or other topological structures on the carrier are filled with the polymer material of the electrically insulating foil or sheet. The electrically insulating foil or sheet may be made of any appropriate duroplastic, thermoplastic or thermosetting material or laminate. In one embodiment, the insulating foil or sheet may be made of a prepreg (short for preimpregnated fibers), that is e.g. made of a combination of a fiber mat, for example glass or carbon fibers, and a resin, for example a duroplastic material. The duroplastic resin may e.g. be made on the basis of an epoxy resin. Prepreg materials are known in the art and are typically used to manufacture PCBs (printed circuit boards). In another embodiment, the insulating foil or sheet may be made of a particle reinforced laminate resin layer. The particles may be made of the same materials as the fibers of a prepreg layer. In one embodiment, the insulating foil or sheet may be made of an unfilled laminate resin layer. As mentioned above, the resin may e.g. be a thermosetting resin. In still another embodiment, the insulating foil or sheet may be made of a thermoplastic material, which melts by application of pressure and heat during lamination and (reversibly) hardens upon cooling and pressure release. Laminate resin layers made of a thermoplastic material may also be unfilled, fiber reinforced or particle reinforced. The thermoplastic material may be one or more materials of the group of polyetherimide (PEI), polyether-sulfone (PES) polyphenylene-sulfide (PPS) or polyamide-imide (PAI).

The carrier on which the semiconductor chip(s) are mounted forms a part of the laminate electronic device. In one embodiment, the carrier may be a PCB (printed circuit board). The PCB may have at least one insulating layer and a structured metal foil layer attached to the insulating layer. The insulating layer is typically made on the basis of epoxy resin, polythetrafluoroethylene, aramid fibers or carbon fibers and may include reinforcement means such as fiber mats, for example glass or carbon fibers. The semiconductor chip(s) are mounted on the structured metal foil layer. Thus, after lamination, the laminate electronic device may virtually be a multi-layer PCB with one or more bare chips integrated therein. In another embodiment, the carrier may be a structured metal plate or sheet such as e.g. a leadframe. The semiconductor chip(s) are mounted on the structured metal plate. The electrically insulating layer or layer stack is laminated onto the structured metal plate and the semiconductor chip(s) mounted thereon to form a build-up laminate structure which covers and embeds the semiconductor chip(s).

The semiconductor chips are bonded onto the structured metal layer of the carrier via a bond layer. In one embodiment, the bond layer is made of diffusion solder. If diffusion soldering is used as a connecting technique, solder materials are used which lead to intermetallic phases after the end of the soldering operation at the interfaces between the electrode pads of the semiconductor chip(s), the diffusion solder bond layer and the structured metal layer of the carrier on account of interface diffusion processes. In this case, the use of AuSn, AgSn, CuSn, AgIn, AuIn, CuIn, AuSi, Sn or Au solders is conceivable.

In one embodiment, the semiconductor chip(s) are bonded to the structured metal layer of the carrier by using a layer of metal particles electrically contacting each other. To this end, it is possible to use electrically conductive adhesives which may be based on epoxy resins or other polymer materials and be enriched with e.g. gold, silver, nickel or copper particles in order to provide for the electrical conductivity. It is also possible to prepare such a layer containing electrically interconnecting particles by either applying so-called nano pastes or by directly depositing metal particles and by performing then a sintering process to produce a sintered metal particle layer.

All aforementioned embodiments, i.e. using diffusion solder or a conductive adhesive or sintered metal particles (either applied in a vaporizable paste or as bare particles) for bonding the semiconductor chip(s) to the structured metal layer of the carrier, allow for generating a bond layer of small thickness. This is due to the specific properties of these materials and their possible application methods. More specifically, the diffusion solder material may be sputtered or galvanically deposited onto the electrode pads of the semiconductor chip(s) in a highly controllable manner such that only small amounts of material can be accumulated on the electrode pads. The paste containing metal particles (i.e. conductive adhesive or nano paste) may be applied by a printing or dispensing technique to the electrode pads of the semiconductor chip(s), and also these methods allow for an application of a specific and controllable amount of material on the electrode pads. That way, it is possible to produce bond layers which have a thickness of less than 10 µm, or even less than 3 µm. Such small heights of the bond layers greatly facilitate the lamination step and thus allow for manufacturing laminate electronic devices of high yield and reliability. Further, the laminate electronic devices may have a small thickness, and the thickness can be precisely defined and may be constant over its lateral dimensions. Still further, the thin film die attach technique described herein promotes the removal of heat away from the semiconductor chip(s). Efficient heat transfer capability is of importance in embedded die technology, particularly if power semiconductor chips are utilized.

A variety of different types of laminate electronic devices may be produced by the techniques described herein. By way of example, the laminate electronic device may constitute a power supply containing one or more power MOSFETs. For instance, the laminate electronic device may comprise a half-bridge circuitry which may e.g. be implemented in electronic circuits for converting DC voltages, so-called DC-DC converters. DC-DC converters may be used to convert a DC input voltage provided by a battery or rechargeable battery into a DC output voltage matched to the demands of electronic circuits connected downstream.

FIGS. 1A to 1F illustrate process steps of a first embodiment of a method of producing a laminate electronic device 100. It is to be noted that the stages of production shown in FIGS. 1A to 1F may be understood as simplifications, since further steps may be used which are not depicted in these figures. For instance, further dielectric layers or structured metal layers may be applied during the assembly of the laminate electronic device 100. Some of the possible variations are explained further below in conjunction with the embodiments illustrated in FIGS. 2 to 6.

According to FIG. 1A, a carrier 10 may be provided. The carrier 10 may comprise an insulating layer 12 made of e.g. a polymer material and a first structured metal layer 14 applied on the top surface of the insulating layer 12. The first structured metal layer 14 may e.g. be a thin metal foil which had previously been applied (e.g. laminated) on the insulating layer 12 and then been structured (e.g. by etching techniques) into a lead pattern (e.g. metal traces). The metal may be of copper or any other suitable material. The insulating layer 12 may be a rigid dielectric layer (or plate) made of a dielectric material such as e.g. epoxy resin or polyester reinforced e.g. by glass, paper etc. In other words, the carrier 10 may e.g. be a standard PCB.

Figure 1B:
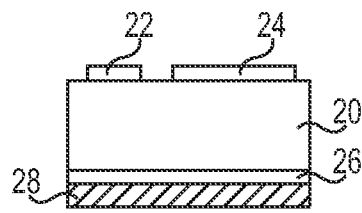

According to FIG. 1B, a semiconductor chip 20 is provided. The semiconductor chip 20 may be of any type as mentioned above. By way of example, as shown in FIG. 1B, the semiconductor chip 20 may be a vertical semiconductor device, having a first electrode pad 22 and a second electrode pad 24 arranged on the top surface and a continuous third electrode pad 26 arranged on the bottom surface. By way of example, the semiconductor chip 20 may be a power MOSFET, and the first, second and third electrode pads may constitute the gate, source and drain contacts, respectively, of the semiconductor chip 20.

The third electrode pad 26 is coated with a bond layer 28. In one embodiment, the bond layer 28 may be made of a diffusion soldering material. In this case, the use of AuSn, AgSn, CuSn, AgIn, AuIn, CuIn, AuSi, Sn or Au solders is conceivable. The bond layer 28 may be applied to the third electrode pad 26 by physical vapor deposition (PVD) techniques such as e.g. sputtering, or by galvanic deposition. Both techniques allow for the application of a small, controllable amount of material which builds-up on the third electrode pad 26 in the shape of a smooth, flat layer.

In another embodiment, the bond layer 28 may be implemented by applying a paste containing metal particles distributed in a polymer material. The paste may be fluid, viscous or waxy. The resin material may e.g. be made of α-terpineol. Pastes containing metal particles can be, for example, purchased from the companies Coocson Electronic (product name: N 1000), Advanced Nano-Particles (ANP), Harima Chemicals (product names: NPS-H and NHD-1) or NBE Technologies (product name: NBE Tech). The metal particles may, for example, be made of silver, gold, copper, tin or nickel. The extensions (average diameter) of the metal particles may be smaller than 100 μm and, in particular, smaller than 50 μm or 10 nm. These pastes are also referred to as nano pastes in the art.

In another embodiment, the bond layer 28 may be implemented by a conductive adhesive, i.e. a polymer paste containing metal particles. These kind of pastes may be applied by the same techniques as nano pastes, as will be explained below in more detail. In conductive adhesives, the polymer material is typically a resin which may be cured upon application of heat and/or pressure.

The application of the paste containing the metal particles dispersed in the polymer liquid may be performed by printing technologies such as e.g. stencil printing, screen printing, ink jet printing. Other techniques for the application of the paste such as e.g. dispensing techniques are also possible. All these techniques likewise allow for the application of a small and controllable amount of paste material (either a conductive adhesive or a nano paste material) on the surface of the third electrode pad 26.

After the application of the bond layer 28 (e.g. diffusion solder or conductive adhesive or nano paste or directly deposited particles), the bond layer 28 may be exposed to a temperature rise. If the bond layer 28 is made of diffusion solder, a temperature in the range of about 180 to 400° C. may be applied to form the intermetallic phase between the electrode pad 26, the solder material of the bond layer 28 and the first structured metal layer 14. The applied temperature may be considerably lower than the melting temperature of the metal of the diffusion solder (when provided in macroscopic dimensions). The applied temperature should preferably be relatively low, e.g. 350° C. or less, in order to prevent any possible damage of the insulating layer 12 of the carrier 10.

Figure 1C:
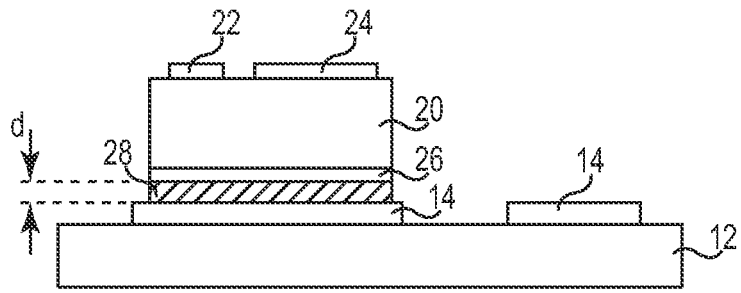

If the bond layer 28 is made of a paste containing metal particles, a temperature in the range between 100 and 300° C. and in particular in the range between 100 and 200° C. may be applied and may prove sufficient. If the paste is a conductive adhesive, this temperature step causes the polymer resin to cure. If the paste is a so-called nano paste, this temperature step causes the polymer liquid in which the metal particles are contained to evaporate and the particles to coalescent and sinter. In this case, the metal bond layer 28 as illustrated in FIG. 1C is a metal bond layer made of sintered metal particles having sizes as mentioned above. In both cases (paste of conductive adhesive or nano paste), the applied temperature may be considerably lower than the melting temperature of the metal of which the metal particles are made (when provided in macroscopic dimensions). For producing the bond layer 28, the carrier 12 and semiconductor chip 20 assembly may be heated by a hot plate or may be placed in an oven.

Further, it is also possible to provide a bond layer 28 made of sintered metal particles by directly applying the metal particles (without paste) and then sintering the applied bare metal particles. It is to be noted that the electrical conductivity of a bond layer 28 made of sintered metal particles is typically higher than the conductivity of a bond layer 28 made of a conductive adhesive (where the metal particles are embedded in a cured resin rather than being sintered).

In all cases, i.e. if the bond layer 28 is made of diffusion solder, an electrically conductive adhesive, a nano paste or directly deposited bare metal particles, the bond layer 28 may be of a thickness d in the range from 1 to 10 μm, in the range from 1 to 5 μm and more particularly in the range from 1 to 3 μm. In particular, the thickness d of the bond layer 28 may be smaller than 2 μm. The small thickness d of the bond layer 28 promotes heat transfer through the bond layer 28 and thus allows for an efficient removal of heat generated in the semiconductor chip 20. Heat removal may further be improved by the selection of the metal material (in the diffusion solder or of the metal particles in the conductive adhesive, the nano paste or of the directly deposited metal particles) used for the bond layer 28. In all cases, materials including Au, Ag, Cu and/or Sn may be preferred because of their high thermal conductivities.

Figure 1D:
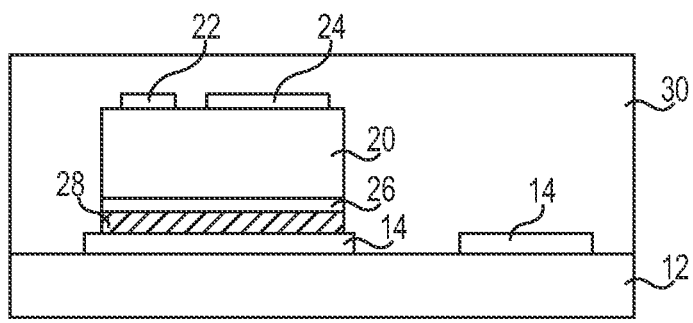

As shown in FIG. 1D, a first insulating layer 30 is then applied to overlay the carrier 12 and the semiconductor chip 20. In one embodiment, the first insulating layer may be a prepreg (i.e. fiber reinforced) resin layer or a particle reinforced resin layer of uncured resin which is applied under pressure and heat. The first insulating layer 30 may be made of known prepreg materials on the basis of epoxy, polyester or other plastic materials, for instance cotton paper reinforced epoxy, woven glass reinforced epoxy, matte glass reinforced polyester, woven glass reinforced polyester, etc. In another embodiment, the first insulating layer 30 may be made of a thermoplastic material.

The first insulating layer 30 may be a foil which may have about the same lateral dimensions as the carrier 10. During lamination, the foil liquefies and encapsulates the semiconductor chip 20 and/or other topologic structure on the carrier 10. After lamination, the top surface of first insulating layer 30 is substantial flat or planar, i.e. does virtually not reproduce the topology beneath the first insulating layer. Thus, the arrangement of the carrier 10 and the semiconductor chip 20 mounted thereon is completely covered by and embedded in the insulating layer 30 free of voids. The structure shown in FIG. 1D may be a multi-layer PCB comprising a bare embedded semiconductor chip 20 mounted on a carrier 10, wherein the carrier 10 itself is a PCB.

The thickness of the semiconductor chip 20 may be less than 100 μm and in particular less than 60 or even 50 or 30 μm. The thickness of the first insulating layer 30 may be less than 200 μm or, in particular, about or less than 100 μm. It is to be noted that a small thickness of the insulating layer 30 of e.g. about 100 μm or less would not be achieved if conventional bond layers such as e.g. soft solder bumps are used, because the thickness of such soft solder bumps is typically about 50 μm or more. Therefore, it is the small and controllable thickness d of the bond layer 28 which allows for using a first insulating layer 30 of a thickness as small as e.g. 100 μm or less.

Figure 1E:
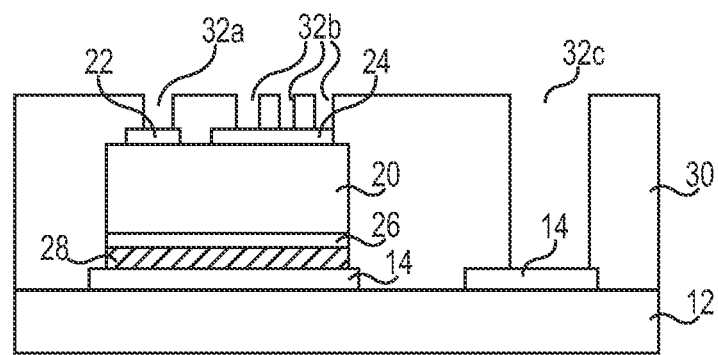

In a later stage of the manufacturing process, openings 32a, 32b, 32c are formed in the top surface of the first insulating layer 30. Openings 32a, 32b, 32c may be generated for instance by conventional drilling, laser drilling, chemical etching or any other appropriate method. The width of the openings 32a, 32b, 32c may, for example, be in the range from 20 to 300 μm. As illustrated in FIG. 1E, an opening 32a may be formed to expose an area of the electrode pad 22, a plurality of openings 32b may e.g. be formed to expose areas of the electrode pad 24 and an opening 32c may be formed to expose a land or trace of the first structured metal layer 14. The openings 32a, 32b, 32c are referred to as vias (vertical interconnect access) or through-connections in the art.

Figure 1F:
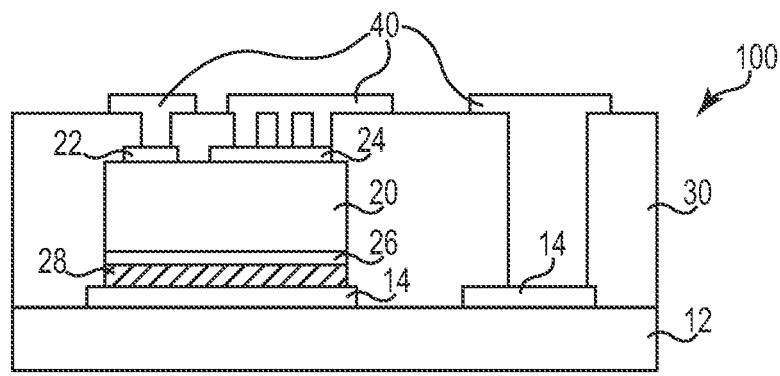

As shown in FIG. 1F, the openings 32a, 32b, 32c may then be filled by an electrically conductive material. For instance, the openings 32a, 32b, 32c may be made conductive by galvanic or electroless plating techniques. As a result, a second structured metal layer 40 is generated on the top surface of the first insulating layer 30. Further, it is also possible to fill the openings 32a, 32b, 32c with a paste containing metal particles. This electrically conductive paste can also be used to make an electrical contact between the electrode pads 22, 24 or the first structured metal layer 14 and the second structured metal layer 40. That way, the gate contact 22 and the source contact 24 may be contacted up to the second structured metal layer (foil) 40, the source contact 24 may be contacted down to a trace or land of the first structured metal layer (foil) 14 and the drain contact 26 may be bonded to another trace or land of the first structured metal layer 14.

It is to be noted that the second structured metal layer 40 may have already been attached to the first insulating layer 30 before laminating the first insulating layer 30 on the carrier 10. In this case, structuring of the second structured metal layer 40 may be accomplished before or after the lamination step. Further, the second structured metal layer 40 may be reinforced by e.g. galvanic plating before, during or after the filling of the openings 32a, 32b, 32c.

As a further variation to the aforementioned method, it is to be noted that the material of the bond layer 28 must not necessarily be applied to the electrode pad 26 of the semiconductor chip 20 before attaching the semiconductor chip 20 to the carrier 10. It is also possible to apply the material of the bond layer 28 to designated areas(s) of the first structured metal layer 14 and then to place the semiconductor chip 20 on the area coated with the material of the bond layer 28. In this case, the same techniques as mentioned above could be used to deposit the material of the bond layer 28 onto the designated area(s) of the first structured metal layer 14.

It is to be noted that the utilization of paste materials or directly deposited metal particles or diffusion solder for the bond layer 28 allows for the generation of a laminate electronic device having a high degree of coplanarity of the upper and lower outer surfaces. This high degree of coplanarity facilitates the steps shown in FIGS. 1E and 1F, i.e. the formation of the openings 32a, 32b, 32c and the filling of the openings 32a, 32b, 32c with a conductive material. Further, a high degree of coplanarity of the laminate electronic device 100 is beneficial to the customer when electrically connecting and implementing the device 100 into a final device. In this context, it is to be noted that conventional bond layers 28 which are e.g. made of soft solder bumps typically cause strong variations in the thickness of the laminate electronic device 100.

FIGS. 2A to 2E illustrate stages of another embodiment of manufacturing a laminate electronic device 200. Without saying, the techniques, materials and methods described above may also be applied to the methods and devices explained further below in conjunction with FIGS. 2A to 2E. In this context, in order to avoid reiteration, reference is made to the description above.

As shown in FIG. 2A, a carrier 110 may comprise an insulating layer 112 which may be similar to and may be made of the same materials as the insulating layer 12 of the first embodiment. The insulating layer 112 is sandwiched between a first (upper) structured metal layer 114 and a third (lower) structured metal layer 115. The first and third structured metal layers 114, 115 may be made of the same materials as the first structured metal layer 14 of the first embodiment. In other words, the carrier 110 may e.g. represent a PCB having structured metal layers on both sides.

Similar to the first embodiment (FIGS. 1A to 1F), patterning of the first (upper) and third (lower) structured metal layers 114, 115 may be accomplished by removing unwanted metal e.g. by etching or other techniques, leaving only the desired metal traces or lands on the carrier 110. All common subtractive methods such as silk screen printing, photoengraving, PCB milling may be used. Further, it is also possible to use additive processes to pattern the upper and lower structured metal layers 114, 115. Additive processes are typically plating processes in which copper or another metal material is plated on the insulating layer 112 in unmasked areas.

As shown in FIG. 2A, patterned areas or traces 114a, 114c, 114d of the upper structured metal layer 114 may be electrically or thermally connected to patterned areas or traces 115a, 115b, 115c, 1145 of the lower structured metal layer 115. Electrically conductive through-connections or vias may be fabricated by conventional drilling, laser drilling etc. and plating-through of the holes to produce the conductive through-connections or vias. That way, the traces 114a and 115a, 114c and 115c, 114d and 115d are electrically interconnected, respectively. The traces 114a and 115b are not electrically interconnected but thermally coupled by thermal vias 117. Thermal vias 117 may be generated by any appropriate method known in the art. Thermal vias 117 are holes which are filled with a material of high thermal conductivity, e.g. a metal material. However, the metal material in the thermal vias 117 is separated from one or both of the conductive traces 114a, 115b in order to prevent these traces 114a, 115b to be electrically interconnected.

As illustrated in FIG. 2B, semiconductor chips 120_1, 120_2 and 120_3 are attached to both sides of the carrier 110. The first and second semiconductor chips 120_1 and 120_2 may be power MOSFETs, and the third semiconductor chip 120_3 may be a logic IC. The first semiconductor chip 120_1 is attached to the first structured metal layer 114 at the upper side of the carrier 110, and the second semiconductor chip 120_2 is attached to the third structured metal layer 115 at the lower side of the carrier 110 opposite to the upper side. Both semiconductor chips 120_1 and 120_2 may be vertical power devices. Thus, by way of example, a gate electrode pad 122 of the first semiconductor chip 120_1 may be electrically connected to the trace 114a of the upper structured metal layer 114, and a source electrode pad 124 of the first semiconductor chip 120_1 may be connected to the trace 114c of the upper structured metal layer 114. Referring to the second semiconductor chip 120_2, a drain electrode pad 126 may be connected to the trace 115c of the lower structured metal layer 115.

In each case, the electrical contact between the structured metal layers 114, 115 and the electrode pads 122, 124, 126 is accomplished by bond layers 128. The bond layers 128 correspond to bond layer 28 of the first embodiment. Thus, the thickness d of the bond layers 128 is limited to the ranges described in conjunction with the first embodiment. Further, the bond layers 128 are made of one of the materials mentioned in conjunction with the first embodiment. Further, methods of application of the material of the bond layers 128 have been described in the context of the first embodiment, and reference is made to this description for the sake of brevity. It is to be noted that the beneficial effects of using bond layers 128 of small thickness are even more pronounced in a double-sided system in which two semiconductor chips 120_1 and 120_2 are arranged at opposite sites relative to the carrier 110. Therefore, multiple-layer PCBs having a high degree of coplanarity and evenness and having a small and constant thickness across its lateral dimensions may be produced that way.

As illustrated in FIG. 2B, the third semiconductor chip 120_3 may be a logic IC. As the logic IC 120_3 is no vertical device, the bond layer 128 is not used to provide an electrical connection between the third semiconductor chip 120_3 and the lower structured metal layer 115. The bond layer 128 is arranged between a metal base plate 127 of the third semiconductor chip 120_3 and the metal trace 115b of the lower structured metal layer 115 and provides for an effective thermal link between the third semiconductor chip 120_3 and the metal trace 115b. As shown in FIG. 2B, heat removal from the third semiconductor chip 120_3 is further assisted by a plurality of thermal vias 117. The thermal vias 117 are operative to efficiently transfer heat through the carrier 110 to the metal trace 114a on the other (upper) side of the carrier 110.

Figure 2C:
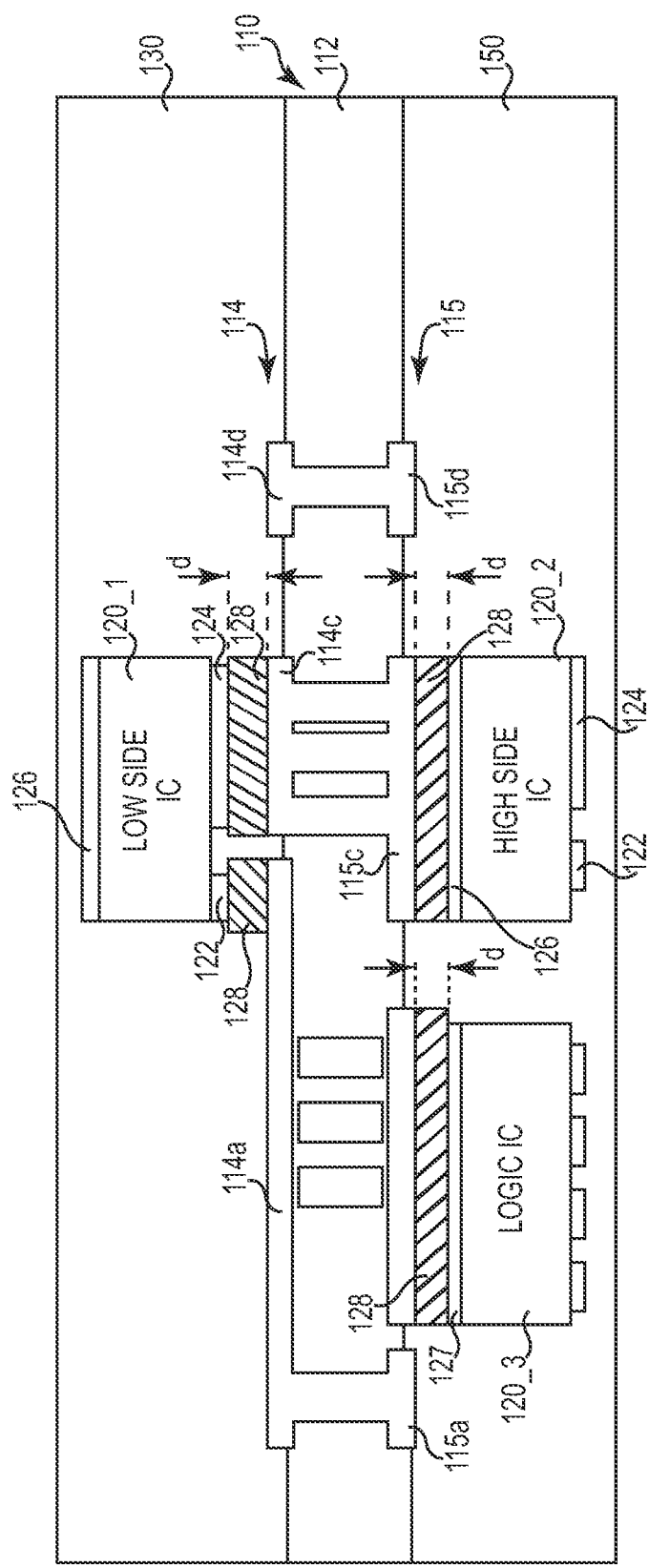

As illustrated in FIG. 2C, a first insulating layer 130 is then applied onto the upper side of the carrier 110 and a second insulating layer 150 is applied onto the lower side of the carrier 110. The first and second insulating layers 130, 150 are applied by a lamination process. The first and the second insulating layers 130, 150 may have the same design and may be made of the same materials as described above for the first insulating layer 30 of the first embodiment. Further, the same processes as described above for the first insulating layer 30 may be used to fix the first and second insulating layers 130, 150 to the carrier 110 (e.g. a double-sided PCB). As shown in FIG. 2C, the semiconductor chip 120_1, 120_2 and 120_3 are embedded in and covered by the material of the first and second insulating layers 130, 150 free of voids. Due to its plasticity during lamination, the polymer material of the first and second insulating layers 130, 150 fills all gaps or topologic structures on both sides of the carrier 110.

Figure 2D:
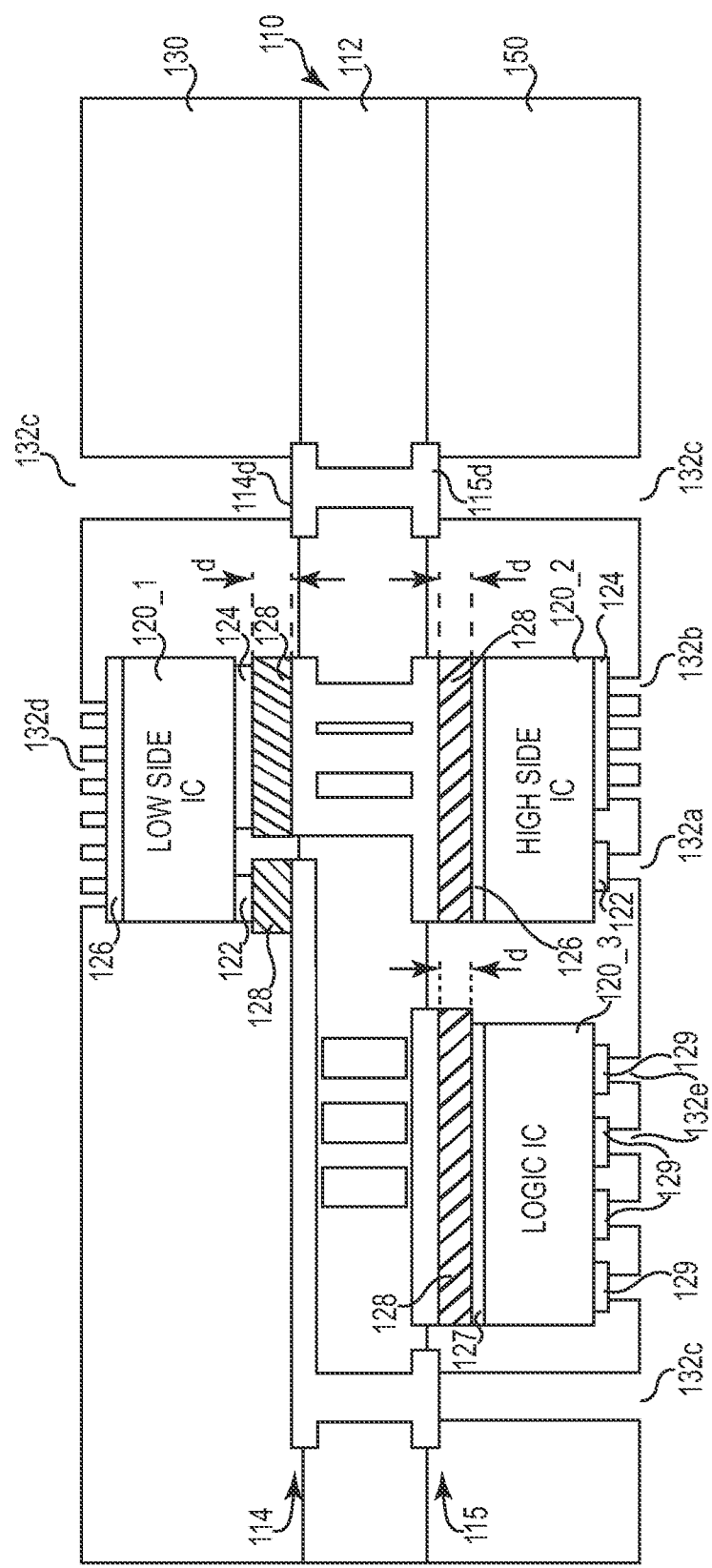

In a subsequent process step, openings 132a, 132b, 132c, 132d and 132e are formed in the outer surfaces of the first and second insulating layers 130, 150, see FIG. 2D. Openings 132a, 132b and 132c are similar to openings 32a, 32b and 32c, respectively, of the first embodiment and reference is made to the description of the first embodiment to avoid reiteration. Openings 132d are generated in the first insulating layer 130 to expose a plurality of areas of the drain electrode pad 126 of the first semiconductor chip 120_1. Openings 132e are formed in the second insulating layer 150 to expose electrode pads 129 of the third semiconductor chip 120_3 (logic IC).

Figure 2E:
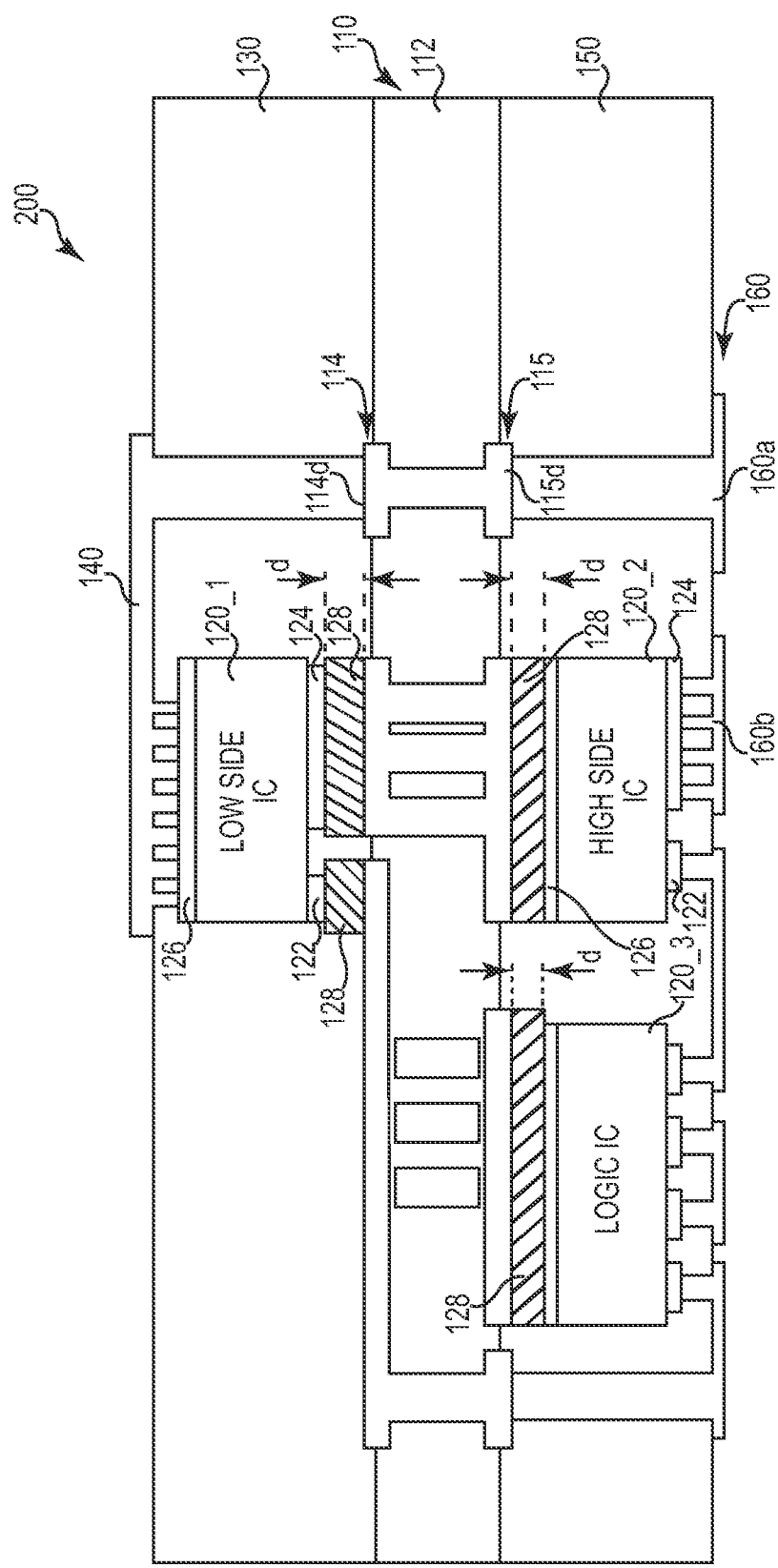

As illustrated in FIG. 2E, a second structured metal layer 140 is applied to the upper surface of the first insulating layer 130 and a fourth structured metal layer 160 is applied to the lower surface of the second insulating layer 150. The second and fourth structured metal layers 140, 160 may be applied to the first and second insulating layers 130, 150 by means of any subtractive or additive process known in the art or described above. In particular, any standard process for the fabrication of a PCB may be used. For instance, the first and second insulating layers 130, 150 may be layers which are coated by metal before being applied onto the upper and lower sides of the carrier 110.

The openings 132a, 132b, 132c, 132d, 132e are filled with metal. In this connection, reference is made to the corresponding description of the first embodiment. It is to be noted that the conductive material in the openings 132c and the electrically interconnected metal traces or lands 114d and 115d of the upper and lower structured metal layers 140, 160 are electrically interconnected to form an electrically conductive through-connection extending from one side of the laminate electronic device 200 to the other side thereof.

The structured areas of the second and fourth structured metal layers 140, 160 may form external contact elements which may be accessible from outside the laminated electronic device 200 and may thus allow electrical contact to be made with the semiconductor chips 120_1, 120_2 and 120_3. In other words, the structured areas of the second and fourth structured metal layers 140, 160 may form external terminals of the laminate electronic device 200 or may form conductor traces leading to external terminals of the laminate electronic device 200.

As shown in FIG. 2E, the first (upper) and third (lower) structured metal layers 114, 115, the second structured metal layer 140 and the fourth structured metal layer 160 form part of a wiring for electrically interconnecting the first, second and third semiconductor chips 120_1, 120_2 and 120_3. More specifically, the gate electrode pads 122 of the power MOSFETs 120_1 and 120_2 are electrically connected to electrode pads 129 of the logic IC 120_3. The source electrode pad 124 of the "low side" power MOSFET 120_1 is electrically connected to the drain electrode pad 126 of the "high side" power MOSFET 120_2. The drain electrode pad 126 of the "low side" power MOSFET 120_1 is electrically connected via a through-connection to a trace or land 160a of the fourth structured metal layer 160. A trace or land 160b of the fourth structured metal layer 160 is electrically connected to the source electrode pad 124 of the "high side" power MOSFET 120_2. Thus, traces or lands 160a and 160b may form the I/O terminals of the laminate electronic device 200, between which the two power MOSFETs 120_1, 1202 are arranged in series and implement two switches which are controlled by the logic IC 120_3.

The laminate electronic device 200 illustrated in FIG. 2E may represent a half-bridge circuitry. The terms "low side" and "high side" refer to this known circuitry. It is to be noted that all semiconductor chips 120_1, 1202, 120_3 are completely embedded in and covered by the first and second insulating layers 130, 150. In other words, the arrangement shown in FIG. 2E may be a multi-layer PCB with completely embedded semiconductor chips 120_1, 1202, 120_3. The term "multi-layer PCB" is used herein to refer to a PCB which comprises at least one structured metal layer 114, 115 inside the PCB. Using this definition of a multi-layer PCB (i.e. a PCB having at least one internal structured metal layer), the laminate electronic devices 100 and 200 of the first and second embodiment, respectively, may be designed as multi-layer PCBs embedding at least one semiconductor chip.

Figure 3:
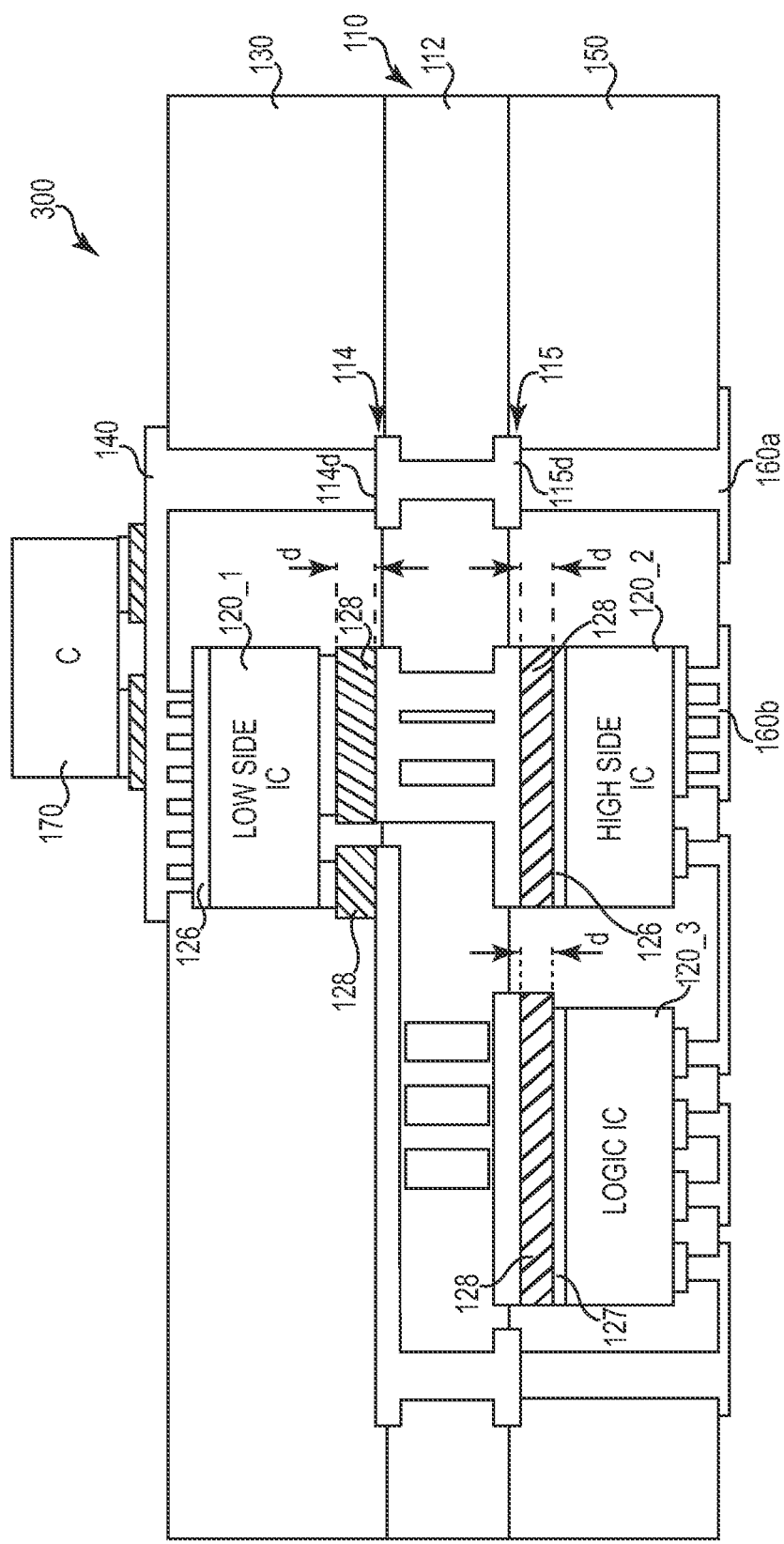
FIG. 3 is a sectional view schematically illustrating one embodiment of a laminate electronic device 300.

In one embodiment, the external metal traces of the second and/or fourth structured metal layers 140, 160 may be used to make electrical contact to passives such as e.g. capacitors, inductors or resistors. Referring to FIG. 3, a laminate electronic device 300 according to a third embodiment comprises a capacitor 170 (or at least one or more passives of other types) attached to the second structured metal layer 140. Without saying, passives may also be surface mounted to the fourth structured metal layer 160 at the lower side of the laminate electronic device 300. Except of the additional passives, the laminate electronic device 300 is similar to the laminate electronic device 200 of the second embodiment, and reference is made to the above description for the sake of brevity.

Figure 4:
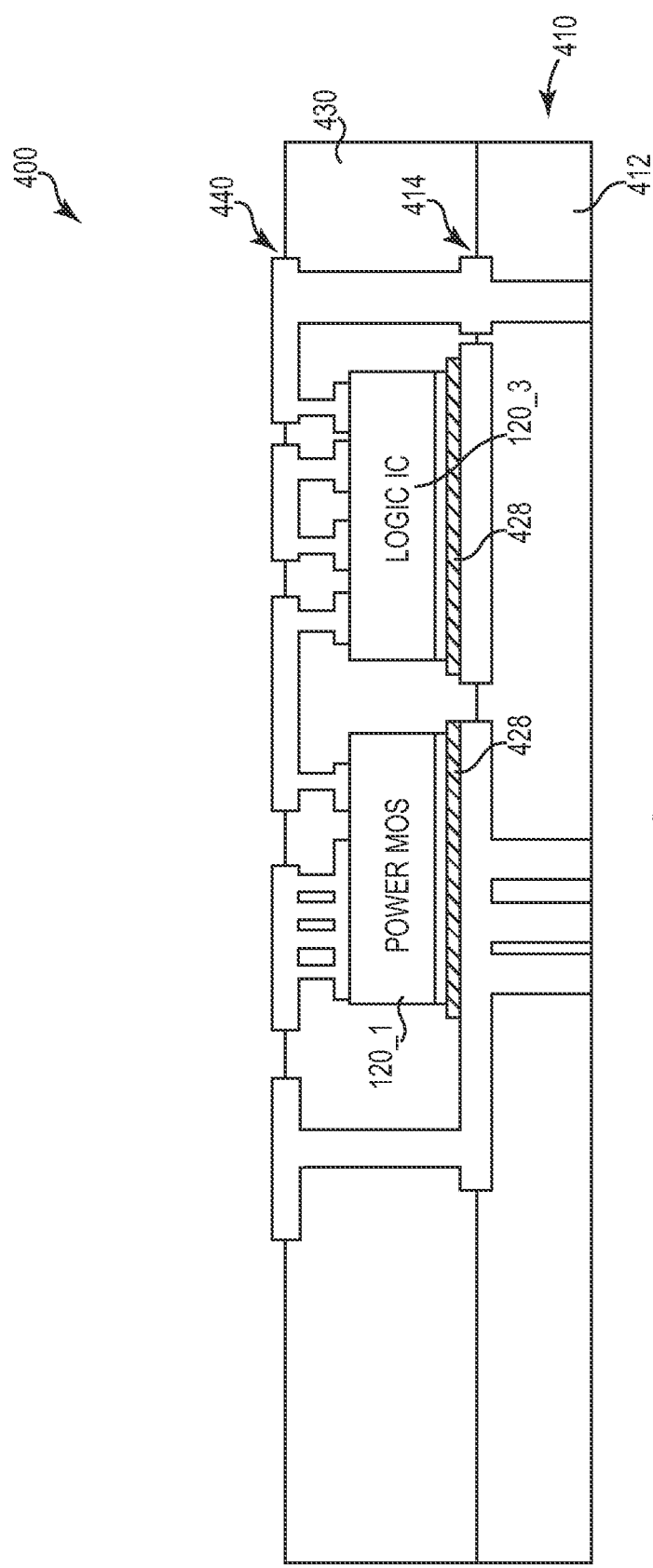
FIG. 4 is a sectional view schematically illustrating one embodiment of a laminate electronic device 400.

A laminate electronic device 400 according to a fourth embodiment is illustrated in FIG. 4. The laminate electronic device 400 may comprise two semiconductor chips 120_1 and 120_3. The first semiconductor chip 120_1 may be a power MOSFET and the third semiconductor chip 120_3 may be a logic IC. The laminate electronic device 400 comprises a carrier 410. The carrier 410 may be a pre-structured PCB having an insulating layer 142 and a first structured metal layer 414. The insulating layer 412 corresponds to the insulating layers 12, 112 of the first and second embodiments, and the first structured metal layer 414 corresponds to the first structured metal layer 14, 114 of the first and second embodiments. The carrier 410 may be provided with holes which could be filled (e.g. plated) with metal to generate electrically conductive through-connections or vias.

The first semiconductor chip 120_1 and the third semiconductor chip 120_3 are mounted on the first structured metal layer 414 by means of a bond layer 428. The bond layer 428 is similar in design, material and dimensions to the bond layers 28, 128 of the first and second embodiments, respectively. To avoid reiteration, reference is made to the corresponding description of the bond layers 28, 128.

The semiconductor chips 120_1 and 120_3 are embedded in and covered by a first insulating layer 430. The first insulating layer 430 corresponds to the first insulating layers 30, 130 of the first and second embodiments and is applied the same way as described above with reference to the insulating layers 30, 130. Further, as may be seen from FIG. 4, the wiring of the laminate electronic device 400 is accomplished by a second structured metal layer 440 and is thus generated in a similar fashion as described above with reference to the second embodiment (refer to the wiring provided by the fourth structured metal layer 160 on the second insulating layer 150).

In all aforementioned embodiments the thicknesses of the various insulating and conducting layers may cover a wide range. By way of example and without restriction on generality, the structured metal layers (foils) 14, 114, 115, 140, 160 may have a thickness in the range between 10 to 1000 µm, the insulating layer 12, 112, 412 may have a thickness of about 200 to 3000 µm, and the first and second insulating layers 30, 130, 150, 430 may have a thickness which is only little greater than the sum of the thickness of the structured metal layers 14, 114, 115, the thickness of the semiconductor chips 12, 120_1, 1202, 120_3 and the thickness d of the bond layer 28, 128, 428, and may e.g. be as small as 100 µm or even less.

Figure 5:
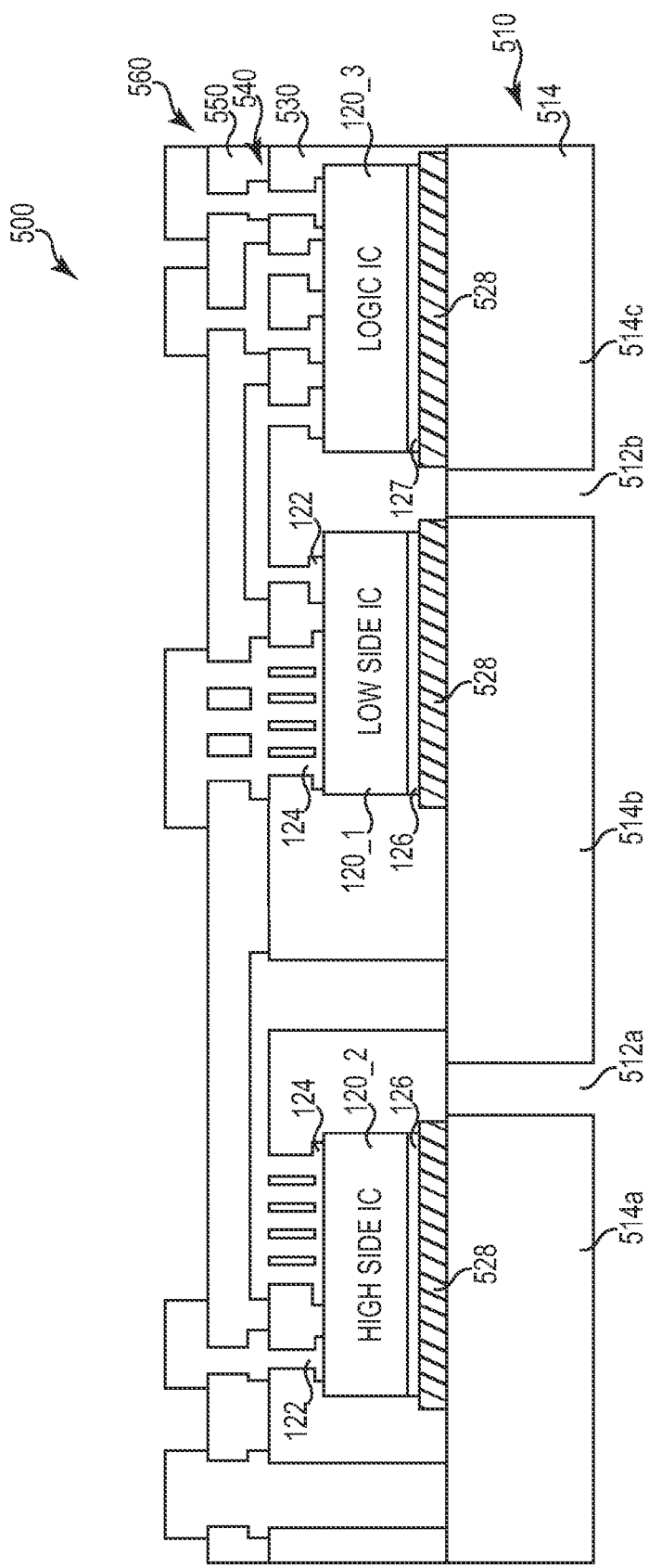
FIG. 5 is a sectional view schematically illustrating one embodiment of a laminate electronic device 500.

A further laminate electronic device 500 according to a fifth embodiment is illustrated in FIG. 5. Similar to the laminate electronic devices 200 and 300 of the second and third embodiments, the laminate electronic device 500 device implements a half-bridge circuitry of e.g. a DC-DC voltage converter. The laminate electronic device 500 comprises a carrier 510 which is made of a patterned metal sheet or plate 514, e.g. a leadframe. The carrier 510 comprises metal plate regions 514a, 514b, 514c, which are separated from each other by spacings 512a, 512b. In one embodiment (not shown in FIG. 5), the spacings 512a, 512b may be filled with an insulating polymer material, e.g. a prepreg or particle reinforced material. The patterned metal sheet or plate 514 may have a sufficient thickness to be rigid. Thus, carrier 510 distinguishes from the carriers 10, 110, 410 of the aforementioned embodiments in that the metal plate 514 and the regions 514a, 514b, 514c thereof are significantly thicker than the first structured metal layer 14, 114, 414. Therefore, in carrier 510, there is no need to use a continuous insulating layer 12, 112, 412 as a support to provide for the necessary rigidity or stiffness. The carrier 510 is no PCB.

Semiconductor chips 120_1, 1202 and 120_3 are mounted on the carrier 510. As already explained above, the semiconductor chips 120_1 and 120_2 are vertical power MOSFETs and the semiconductor chip 120_3 is a logic IC to control the gate electrode pads 122 of the semiconductor chips 120_1 and 1202. The attachment of the semiconductor chips 120_1, 1202 and 120_3 is accomplished via a bond layer 528 (corresponding to bond layers 28, 128, 428) and has been described in detail above. As in the second and third embodiments, the bond layer 528 beneath the semiconductor chips 120_1 and 1202 serves as an electrical connection whereas the bond layer 528 beneath the semiconductor chip 120_3 merely serves as a mechanical fixing means and a heat conductor.

The laminate electronic device 500 comprises two build-up insulating layers 530, 550 laminated onto the carrier 510 and the semiconductor chips 120_1, 1202, 120_3. Both insulating layers 530, 550 may be made of the same materials and may be processed according the same methods as described above with reference to the a foregoing embodiments. Similar to insulating layers 30, 130, 150, 430, the first insulating layer 530 may be a prepreg or particle reinforced resin layer coated with a second structured metal layer 540 (which corresponds to structured metal layers 40, 140, 160, 440—reference is made to the description of these layers). However, in this embodiment, the second structured metal layer 540 is an internal metal layer. The second insulating layer 550 overlys the second structured metal layer 540 and may likewise be provided by a prepreg or particle reinforced resin layer. It forms a support for a third structured metal layer 560 which may form external terminals of the laminate electronic device 500 or may form conductor traces leading to external terminals of the laminate electronic device 500.

Figure 6:
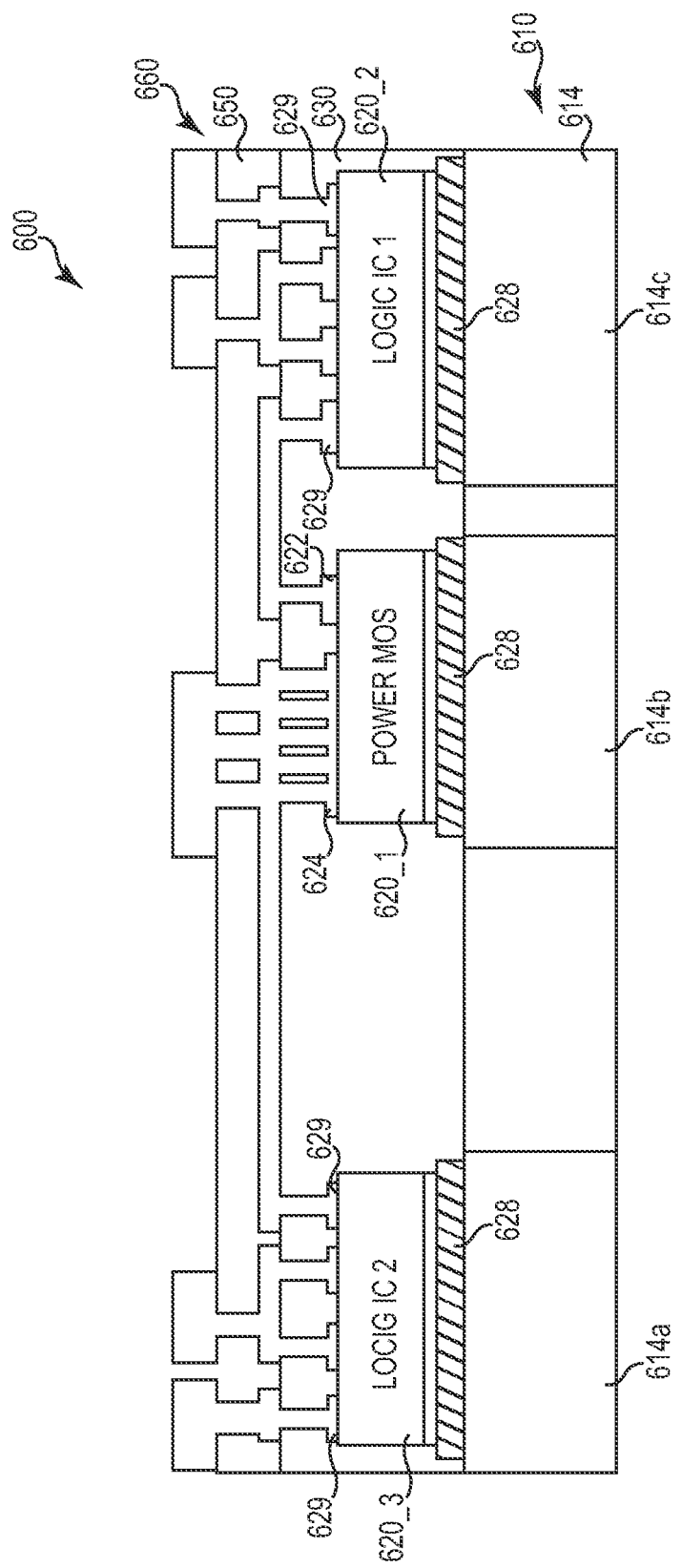
FIG. 6 is a sectional view schematically illustrating one embodiment of a laminate electronic device 600.

A further laminate electronic device 600 according to a sixth embodiment is illustrated in FIG. 6. The laminate electronic device 600 comprises a carrier 610 which is made of a patterned metal sheet or plate 614, e.g. a leadframe. The carrier 610 comprises metal plate regions 614a, 614b, 614c, which are separated from each other by spacings, wherein the spacings are filled with an insulating polymer material 612a, 612b, e.g. a prepreg or particle reinforced resin layer material. Similar to the fifth embodiment, the patterned metal sheet or plate 614 may have a sufficient thickness to be rigid. To avoid reiteration, reference is made to the description of the metal sheet or plate 514 of the fifth embodiment.

Semiconductor chips 620_1, 6202 and 620_3 are mounted on the carrier 610. Semiconductor chip 620_1 is a power MOSFET and semiconductor chips 6202 and 620_3 are logic ICs. In this embodiment, all semiconductor chips 620_1, 6202 and 620_3 are non-vertical devices. Thus, all electrode pads 629 of the logic ICs 6202, 620_3 and all electrode pads (gate pad 622, source pad 624 and drain pad—not apparent in this sectional view) of the power MOSFET 620_1 are arranged on one main face of the semiconductor chips, respectively.

The attachment of the semiconductor chips 620_1, 6202 and 620_3 is accomplished via a bond layer 628. The bond layer 628 corresponds to bond layers 28, 128, 428, 528 which have been described in detail above. Reference is made to this description in order to avoid reiteration.

Similar to laminate electronic device 500 of the fifth embodiment, laminate electronic device 600 comprises two build-up insulating layers 630, 650 laminated onto the carrier 610 and the semiconductor chips 620_1, 6202, 620_3. The insulating layers 630, 650 correspond to layers 530 and 550 of the fifth embodiment, and reference is made to the description thereof above.

The first insulating layer 630 may be coated with a second structured metal layer 640 (which corresponds to the second structured metal layers 40, 140, 160, 440, 540-reference is made to the description of these layers). Similar to second structured metal layer 540, the second structured metal layer 640 is an internal metal layer. The second insulating layer 650 is overlying the second structured metal layer 640 and forms a support for a third structured metal layer 660 which may form external terminals of the laminate electronic device 600 or may form conductor traces leading to external terminals of the laminate electronic device 600.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. By way of example, the different carriers 110 (e.g. double-sided PCB), 410 (e.g. single-sided PCB), 510 (e.g. leadframe), 610 (e.g. leadframe filled with polymer) may be combined with any circuitry or laminate layer stack disclosed in the various embodiments. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multi-layer printed circuit board having an embedded chip, the multi-layer printed circuit board comprising:
   a printed circuit board having a dielectric substrate and a first structured metal layer arranged on a first main surface of the dielectric substrate;
   a first semiconductor chip bonded to the first structured metal layer via a first bond layer made of metal particles electrically contacting each other or diffusion solder;
   a first insulating layer overlying the first structured metal layer and the first semiconductor chip;
   a second structured metal layer arranged on a second main surface of the dielectric substrate opposite to the first main surface;
   a second semiconductor chip bonded to the second structured metal layer via a second bond layer made of metal particles electrically contacting each other or diffusion solder; and
   a second insulating layer overlying the second structured metal layer and the second semiconductor chip.

2. The multi-layer printed circuit board of claim 1, wherein the second semiconductor chip is a vertical device.

3. A multi-layer printed circuit board having an embedded chip, the multi-layer printed circuit board comprising:
   a printed circuit board having a dielectric substrate and a first structured metal layer arranged on a first main surface of the dielectric substrate;
   a first semiconductor chip bonded to the first structured metal layer via a first bond layer made of metal articles electrically contacting each other or diffusion solder; and
   a first insulating layer overlying the first structured metal layer and the first semiconductor chip, wherein the first semiconductor chip has a first major surface and an opposing second major surface including at least one electrode pad, wherein the first semiconductor chip is mounted on the first structured metal layer with the first bond layer bonding the at least one electrode pad to the first structured metal layer.

4. The multi-layer printed circuit board of claim 3, wherein the first major surface faces away from the first structured metal layer and includes one or more electrode pads.

5. The multi-layer printed circuit board of claim 3, wherein the first semiconductor chip is a vertical device.

* * * * *